US005793246A

United States Patent [19]
Vest et al.

[11] Patent Number: 5,793,246
[45] Date of Patent: Aug. 11, 1998

[54] HIGH VOLTAGE PUMP SCHEME INCORPORATING AN OVERLAPPING CLOCK

[75] Inventors: William B. Vest, Santa Clara; John C. Costello, San Jose. both of Calif.

[73] Assignee: Altera Corporation, San Jose. Calif.

[21] Appl. No.: 555,238

[22] Filed: Nov. 8, 1995

[51] Int. Cl.[6] .................. H02M 3/07; H02M 7/25
[52] U.S. Cl. .................. 327/536; 327/541; 327/543; 365/185.18; 307/110
[58] Field of Search .................. 327/536, 534, 327/537, 589, 535, 541, 543, 538, 539; 307/110; 365/185.18

[56] References Cited

U.S. PATENT DOCUMENTS

| | | | |
|---|---|---|---|
| 4,609,986 | 9/1986 | Hartmann et al. | 364/200 |
| 4,617,479 | 10/1986 | Hartmann et al. | |
| 4,636,657 | 1/1987 | Reddy | 327/589 |
| 4,677,318 | 6/1987 | Veenstra | |
| 4,713,792 | 12/1987 | Hartmann et al. | 364/900 |
| 4,769,784 | 9/1988 | Doluca et al. | 327/537 |
| 4,871,930 | 10/1989 | Wong et al. | |
| 4,899,067 | 2/1990 | So et al. | |
| 4,912,342 | 3/1990 | Wong et al. | |
| 5,036,229 | 7/1991 | Tran | 327/536 |
| 5,043,858 | 8/1991 | Watanabe | 327/536 |
| 5,093,586 | 3/1992 | Asari | 327/536 |
| 5,121,006 | 6/1992 | Pedersen | |
| 5,241,224 | 8/1993 | Pedersen et al. | |
| 5,247,208 | 9/1993 | Nakayama | 327/537 |
| 5,260,610 | 11/1993 | Pedersen et al. | |
| 5,260,611 | 11/1993 | Cliff et al. | |
| 5,301,097 | 4/1994 | McDaniel | 307/110 |
| 5,350,954 | 9/1994 | Patel | |
| 5,381,051 | 1/1995 | Morton | 327/390 |
| 5,394,372 | 2/1995 | Tanaka et al. | 327/536 |
| 5,426,333 | 6/1995 | Maeda | 327/536 |
| B1 4,617,479 | 9/1993 | Hartmann et al. | |

Primary Examiner—Timothy P. Callahan
Assistant Examiner—Terry L. Englund
Attorney, Agent, or Firm—Townsend and Townsend and Crew LLP

[57] ABSTRACT

A system for generating voltages on an integrated circuit utilizes an overlapping clocking scheme. An oscillator (220) generates the overlapping clock signals. which are coupled through oscillator buffers (225). to row pumps (230). In response to the overlapping clock signals, row pumps (230) generate high voltages. typically higher than the VDD voltage of the integrated circuit. These high voltages may be used to program programmable memory cells or interface to logic components of the integrated circuit.

39 Claims, 9 Drawing Sheets

HIGH VOLTAGE PUMP SCHEME INCORPORATING AN OVERLAPPING CLOCK

BACKGROUND OF THE INVENTION

This invention relates to the field of integrated circuits (also known as "chips"). More specifically, the present invention is a system for generating high voltages for an integrated circuit, especially useful for enhancing and speeding the critical path and also programming the memory cells of the integrated circuit.

Many integrated circuits require high voltages. For example, there are numerous integrated circuits with electrically programmed (or erased) memory cells such as programmable logic devices (PLDs) and EPROM, EEPROM, and Flash memories. These may be fabricated using technologies including electrically programmable read-only memory (EPROM) cells, electrically erasable programmable read-only memory (EEPROM) cells, Flash, antifuse, as well as many others. Many times, these memories use cells having floating gates. To program these cells, high voltages are used to transfer charge to the floating gates through the silicon dioxide by various physical mechanisms such as avalanche injection, channel injection, quantum-mechanical tunneling, and other phenomena. To erase the cells, for EEPROM and Flash memory cells, charge is electrically removed from the floating gate using high voltages; while for EPROM memory cells, charge is removed from the floating gates by exposing the cells to radiation, such as ultraviolet light. After erasure, the memory cells may be reprogrammed. Moreover, EPROM, EEPROM, and Flash memory cells may be programmed, erased, and reprogrammed many times.

Typically, the VDD (or VCC) of the integrated circuit is used for the normal (e.g., nonprogramming) operation of these memory cells. VDD is usually 5 volts, although 3.3-volt supplies are also common. As device and feature sizes on integrated circuits continue to shrink, future supply voltages may be reduced even further to, for example, 2.5 volts.

To program (and in some case, to erase) these memory cells, however, a higher potential than VDD is usually needed. Depending on the processing technology used, the internal integrated circuit voltages used to program these memory cells may be from 7 volts to 20 volts or more. For some integrated circuits, these high voltages are generated externally or off-chip. However, numerous charge pumping circuits are known for generating high potentials from a lower potential to allow internally generated high voltages.

Further, these high voltage generators may be used during normal chip operation to provide high voltages to critical path and other circuitry to enhance and speed-up the operation of many integrated circuits, including memories, microprocessors, application specific integrated circuits (ASICs), and programmable logic devices (PLDs). PLDs are well known to those in the electronic art. Such programmable logic devices are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, and MAX® 5000, MAX® 7000, and FLEX® 8000 EPLDs made by Altera Corp.

PLDs are generally known in which many logic arrarys blocks (LABs) provided in a two-dimensional array. Further, PLDs have an array of intersecting signal conductors for programmably selecting and conducting logic signals to, from, and between the LABs. LABs contain a number of individual programmable logic elements (LEs) which provide relatively elementary logic functions such as NAND, NOR, and exclusive OR. The configuration of these PLDs are typically controlled by way of programmable memory cells, often requiring high voltage circuitry for programming. These cells include DRAM, SRAM, EPROM, EEPROM, and Flash memories. As integrated circuits become smaller and denser, it becomes possible to put greater numbers of programmable logic elements, and consequently more programmable memory cells, onto one integrated circuit. Hence, it becomes increasingly important to improve the techniques and architectures used for programming the programmable elements and enhancing the performance of PLDs.

Therefore, while existing high voltage pumping schemes have met with substantial success, such schemes also meet with certain limitations. In particular, such on-chip charge pumping circuits and voltage generators may consume significant amounts of power, often are relatively difficult to design and fabricate, operate somewhat inefficiently, may interfere with the operation of other devices on the integrated circuit, and may also be quite large, requiring a considerable amount of substrate area.

As can be seen, an improved technique for generating high voltages is needed, especially a scheme with improved efficiency, enhanced operating characteristics, and reduced size.

SUMMARY OF THE INVENTION

The present invention is a high voltage generation scheme using an overlapping clock signal for generating voltages above VDD. The present invention may be used in many different types of integrated circuits, including microprocessors, memories, programmable logic devices, and application specific integrated circuits.

In the present invention, an overlapping clocking scheme is used to generate high voltages using a voltage charge pump. More specifically, a first clock signal and a second clock signal are coupled to a two-stage voltage charge pump. The first clock signal is synchronous with the second clock signal. A rising edge of the second clock signal follows, after a delay, a rising edge of the first clock signal. This delay is not more than a pulse width of the first clock signal. Furthermore, a falling edge of the second clock signal follows a falling edge of the first clock signal. Therefore, the first clock signal and the second clock signal are overlapping.

In the voltage charge pump, a first node is boosted through a first capacitor with the first clock signal. This charge is passed to a second node. Charge is dynamically stored at this second node. While the charge at the second node is at approximately a maximum, the second node is boosted through a second capacitor with the second clock signal. The delay between the first and the second clock signal is short enough in duration so that the second node is at a maximum level of charge. The boosted charge at the second node is passed to a third node, which is the high voltage output node of the voltage charge pump. The third node is coupled to the circuitry on the integrated circuit which requires a high voltage.

The scheme of the present invention provides greater efficiency at producing high voltages. Further, the capacitor sizes for the first capacitor and second capacitor may be reduced to about sixty percent of the size used in a nonoverlapping clocking scheme case. This represents a substantial savings in integrated circuit area since an integrated circuit may contain many voltage charge pumps.

In accordance with the teachings of this invention, a method for generating voltages on an integrated circuit comprises the steps of: generating a first clock signal, where the first clock signal alternates between a first voltage level and a second voltage level, where the first voltage level is above the second voltage level; generating a second clock signal, where the second clock signal is synchronous with the first clock signal and a rising edge of the second clock signal follows a rising edge of the first clock signal after a delay, where this delay is not greater than a pulse width of the first clock signal. Further steps include: charging a first node with the first clock signal; transferring a charge of the first node to a second node; charging the second node with the second clock signal; transferring a charge of the second node to the third node; and producing a third voltage level at the third node by repeating the steps of charging the first node, transferring charge to the second node, charging the second node, and transferring charge to the third node, where the third voltage level is above the second voltage level.

Furthermore, in a further embodiment of the present invention, a system for generating voltages on an integrated circuit includes: a clock generator, which generates a first clock signal and a second clock signal, where the second clock signal overlaps with the first clock signal; and a voltage pump, where the first clock signal is coupled to a first capacitor of the voltage pump and the second clock signal is coupled to a second capacitor of the voltage pump.

Other objects, features, and advantages of the present invention will become apparent upon consideration of the following detailed description and the accompanying drawings, in which like reference designations represent like features throughout the figures.

DESCRIPTION OF THE PREFERRED EMBODIMENT

Figure 1:
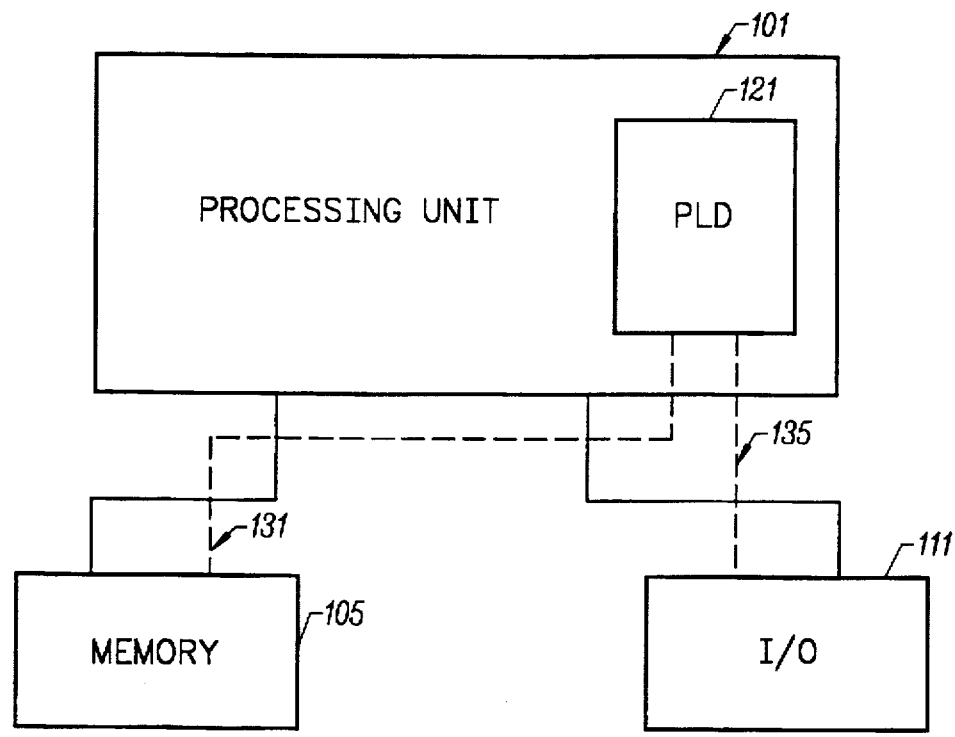
FIG. 1 is a block diagram illustrating a digital system which may incorporate the present invention.

FIG. 1 shows a block diagram of a digital system within which the present invention may be incorporated. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card Flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
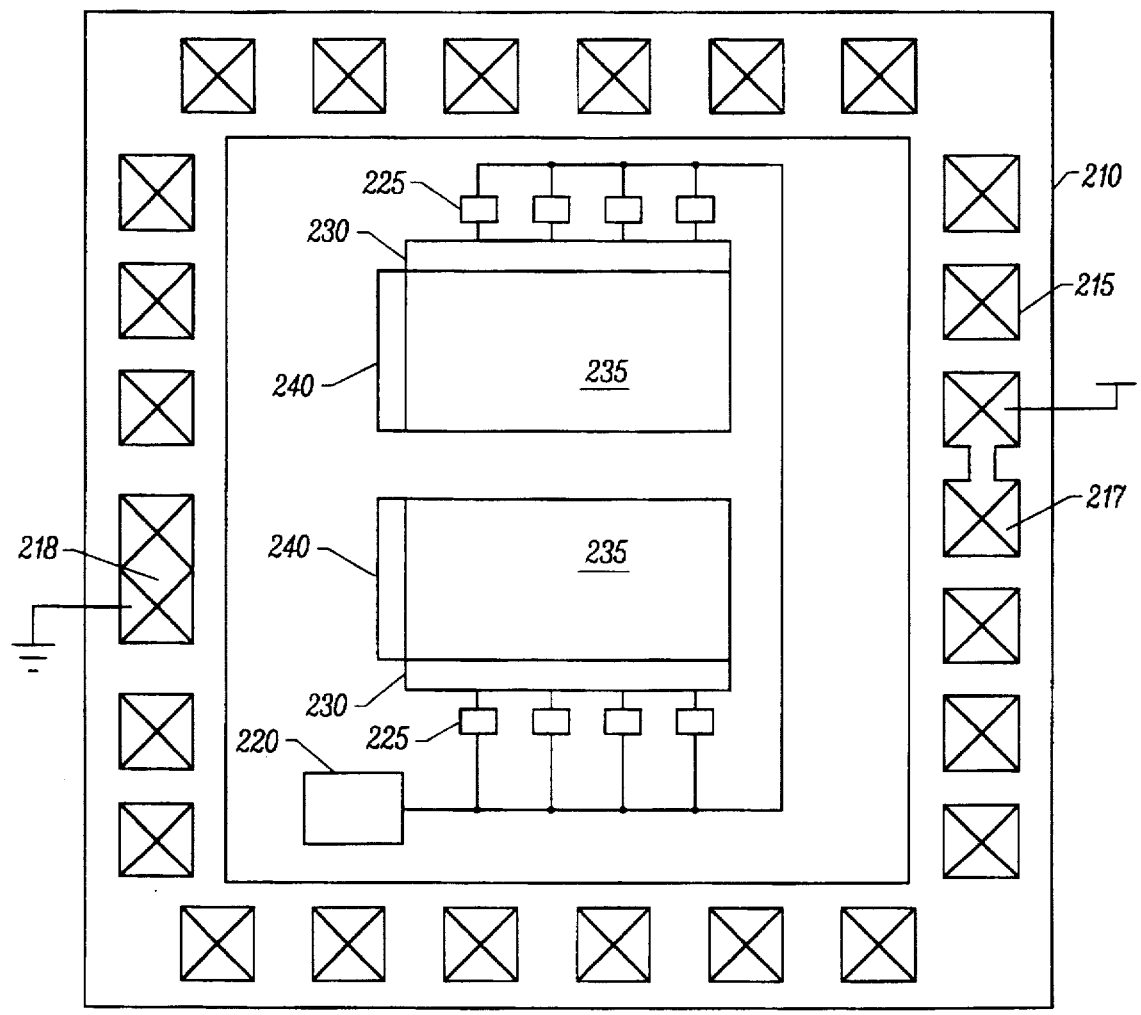
FIG. 2 is a block diagram of an integrated circuit showing a high voltage pumping distribution scheme of the present invention.

FIG. 2 shows an integrated circuit showing a high voltage pumping distribution system. Integrated circuit 210 is typically a silicon die fabricated using a semiconductor process. Integrated circuit 210 may be used to implement memory 105, PLD 121, or any of the other multitude of components and integrated circuits in the digital system of FIG. 1. Within an integrated circuit, there is often a need for high voltage circuitry to generate and deal with high voltages. This high voltage circuitry generates high voltages. High voltages are used within an integrated circuit for a multitude of purposes. For example, in a memory integrated circuit, high voltages may be used to program and erase the memory cells. In a programmable logic device, high voltages may be used to configure the configuration or memory cells that control the logic circuits. Furthermore, high voltages may be used to implement high-speed logic gates and other circuitry in a microprocessor or similar integrated circuit.

Integrated circuit 210 is comprised of pads 215 which are used to interface with components external to the chip. One pad is coupled to a first voltage supply 217. Another pad is coupled to second voltage supply 218. First voltage supply 217 and second voltage supply 218 are typically external supplies for supplying power to integrated circuit 210. First voltage supply 217 is at a first voltage level above a second voltage level of the second voltage supply 218. Furthermore, the high voltages generated by the high voltage generation scheme of the present invention are at voltage level above the first voltage level 217. Typically, first voltage supply 217 is VDD (or VCC), and second voltage supply 218 is VSS. Typically, VDD is 5 volts and VSS is ground. Furthermore, to facilitate highly integrated semiconductor circuits, the typical voltage supply of 5 volts has been reduced to a voltage level less than 5 volts, commonly from about 3.3 volts to 3.6 volts. In the future, supply voltages may even be reduced even further to, for example, 2.5 volts.

Via pads 215, integrated circuit 210 may drive signals to other integrated circuits and receive signals from other integrated circuits. Integrated circuit 210 contains the voltage generation scheme of the present invention. This voltage pumping scheme creates the high voltages used within integrated circuit 210. The system is comprised of an oscillator 220, generating a control signal, which is coupled to a plurality of oscillator buffers 225. This control signal may be a clock signal. These oscillator buffers 225 are, in turn, coupled to row pumps 230. Row pumps 230 create the high voltages used to program the memory cells or configuration bits or interface with the logic gates in block 235. Furthermore, if block 235 contains an array of memory cells, then a plurality of additional circuits 240 such as selection devices or shift registers may also be used in the programming scheme. For example, selection devices may be used to select the rows or columns of cells or particular cells to provide high voltages to. The high voltage circuits described are incorporated within integrated circuit 210 along with the other circuits, logic gates, memory cells, transistors, and other devices on integrated circuit 210. Furthermore, one integrated circuit incorporating the voltage generation scheme of the present invention may provide the high voltages for another integrated circuit.

Figure 3:
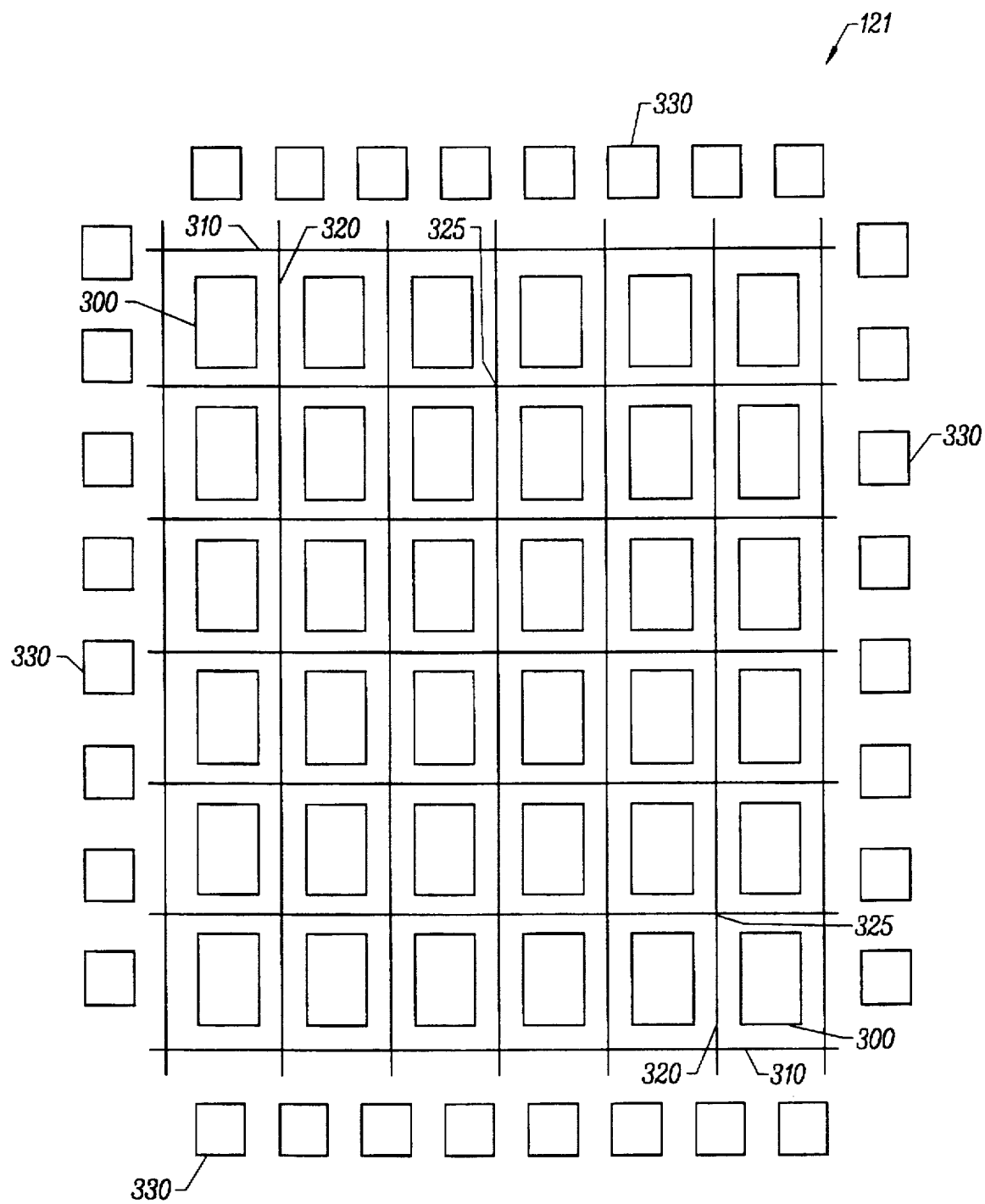
FIG. 3 is a block diagram of a programmable logic device in which the present invention may be used.

FIG. 3 is a simplified block diagram of the overall internal architecture and organization of PLD 121 of FIG. 1. Many details of PLD architecture, organization, and circuit design are not necessary for an understanding of the present invention and such details are not shown in FIG. 3. The high voltage generation scheme of the present invention may be used in PLD 121 shown in FIG. 3.

FIG. 3 shows a six-by-six two-dimensional array of thirty-six logic array blocks (LABs) 300. LAB 300 is a physically grouped set of logical resources that is configured or programmed to perform logical functions. The internal architecture of a LAB will be described in more detail below in connection with FIG. 4. PLDs may contain any arbitrary number of LABs, more or less than the PLD 121 shown in FIG. 3. Some PLDs may even contain a single LAB. However, generally in the future, as technology advances and improves, programmable logic devices with even greater numbers of logic array blocks will undoubtedly be created.

LAB 300 has inputs and outputs (not shown) which may or may not be programmably connected to a global interconnect structure, comprising an array of global horizontal interconnects (GHs) 310 and global vertical interconnects (GVs) 320. Although shown as single lines in FIG. 3, each GH 310 and GV 320 line represents a plurality of signal conductors. The inputs and outputs of LAB 300 are programmably connectable to an adjacent GH 310 and an adjacent GV 320. Utilizing GH 310 and GV 320 interconnects, multiple LABs 300 may be connected and combined to implement larger, more complex logic functions than can be realized using a single LAB 300.

In one embodiment, GH 310 and GV 320 conductors may or may not be programmably connectable at intersections 325 of these conductors. Also, in some embodiments, intersection 325 may have programmable drivers for selecting the signal from a conductor in one direction and buffer the signal and drive it onto one of the alternate conductors in the same or different direction. Moreover, GH 310 and GV 320 conductors may make multiple connections to other GH 310 and GV 320 conductors. Various GH 310 and GV 320 conductors may be programmably connected together to create a signal path from a LAB 300 at one location on PLD 121 to another LAB 300 at another location on PLD 121. Furthermore, an output signal from one LAB 300 can be directed into the inputs of one or more LABs 300. Also, using the global interconnect, signals from a LAB 300 can be fed back into the same LAB 300. In other embodiments of the present invention, only selected GH 310 conductors are programmably connectable to a selection of GV 320 conductors. Furthermore, in still further embodiments, GH 310 and GV 320 conductors may be specifically used for passing signal in a specific direction, such as input or output, but not both.

The global interconnect may contain long and segmented conductors. Long conductors run the entire length or width of PLD 121. In particular, long conductors may programmably couple LABs along a length or width of PLD 121. Segmented conductors are for shorter length interconnections. For example, segmented conductors may include double lines for interconnections between two LABs 300. Other segmented conductors include, among other, triple lines, quadruple lines, quintuple lines, sextuple lines, and other similar interconnection resources. Furthermore, at intersections 325, segmented conductors may be programmably coupled (or programmably uncoupled) to other long or segmented conductors, in the same or different direction. Intersection 325 may sometimes be referred to as a "switch box." As an example, a double line may be programmably coupled to other double, long, or segmented lines, in the same or different direction, at intersections 325.

The PLD architecture in FIG. 3 further shows at the peripheries of the chip, input-output drivers 330. Input-output drivers 330 are for interfacing the PLD to external, off-chip circuitry. FIG. 3 shows thirty-two input-output drivers 330; however, a PLD may contain any number of input-output drivers, more or less than the number depicted. Each input-output driver 330 is configurable for use as an input driver, output driver, or bidirectional driver.

Figure 4:
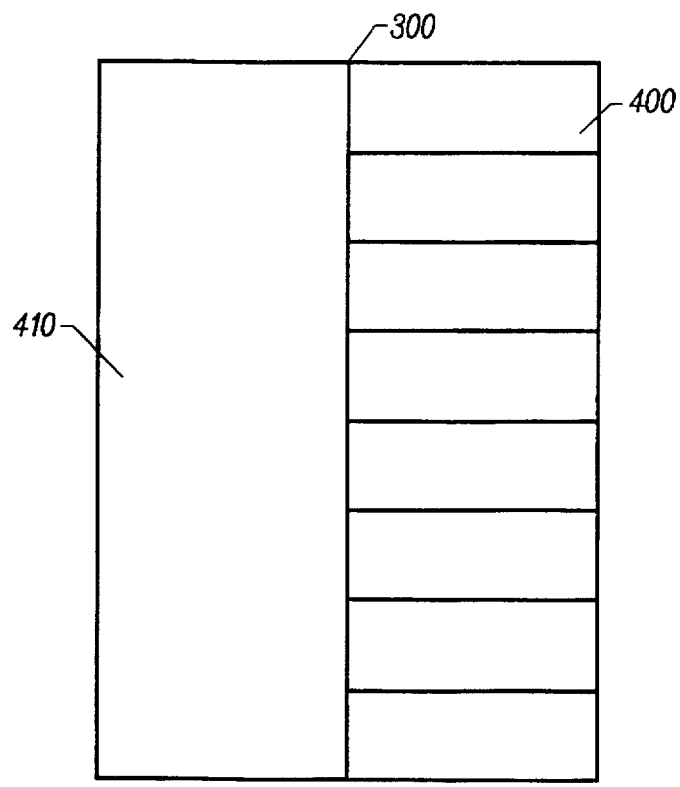
FIG. 4 is a block diagram of a logic array block of a programmable logic device.

FIG. 4 shows a simplified block diagram of LAB 300 of FIG. 3. LAB 300 is comprised of a varying number of logic elements (LEs) 400, sometimes referred to as "logic cells," and a local (or internal) interconnect structure 410. LAB 300 has eight LEs 400, but LAB 300 may have any number of LEs, more or less than eight. In a further embodiment of the present invention, LAB 300 has two "banks" of eight LEs for a total of sixteen LEs, where each bank has common inputs, but separate outputs and control signals. In some embodiments, LAB 300 includes carry chains.

A general overview of LE 400 is presented here, sufficient to provide a basic understanding of LAB 300. LE 400 is the smallest logical building block of a PLD. Signals external to the LAB, such as from GHs 310 and GVs 320, are programmably connected to LE 400 through local interconnect structure 410, although LE 400 may be implemented in many architectures other than those shown in FIGS. 1-4. In one embodiment, LE 400 of the present invention incorporates a function generator that is configurable to provide a logical function of a number of variables, such as a four-variable Boolean operation. As well as combinatorial functions, LE 400 also provides support for sequential and registered functions using, for example, D flip-flops. LE 400 may be configured using the high voltages generated by the scheme of the present invention.

Figure 5:
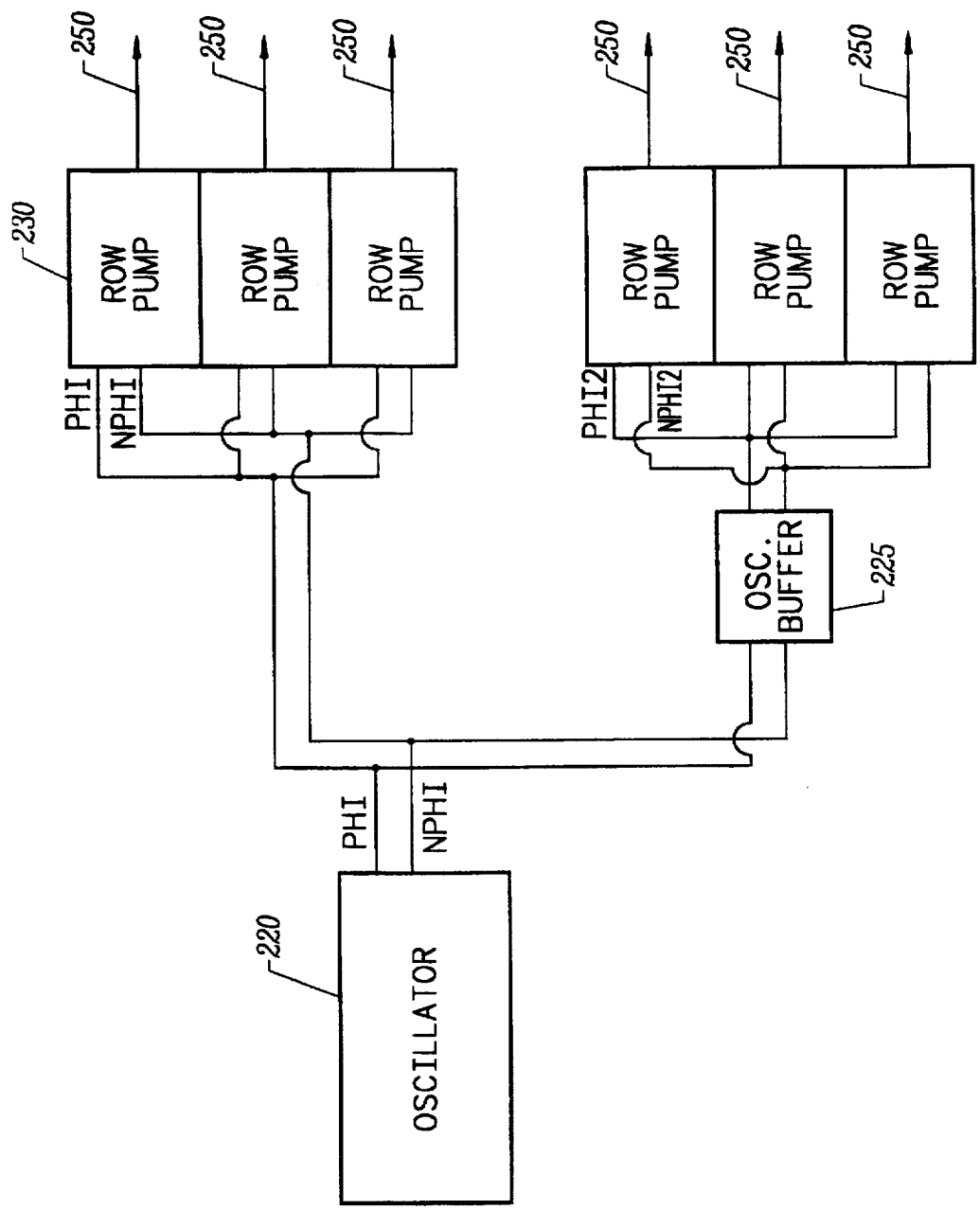
FIG. 5 is a more detailed block diagram of a voltage pumping scheme.

FIG. 5 shows a more detailed block diagram of a high voltage pumping scheme for an integrated circuit. The pumping scheme comprises an oscillator 220 coupled to a plurality of row pumps 230. Oscillator 220 may be coupled through a plurality of oscillator buffers (as shown in FIG. 2) to row pumps 230. In response to control signals from oscillator 220, row pump 230 generates a high voltage output at an output node 250. This embodiment has one oscillator 220 and six row pumps 230. In other embodiments of the present invention, depending on the size of the integrated circuit, there may be more than one oscillator 220 and there may be more than six row pumps 230. For example, there may be thirty rows of memory cells and hence, there would be thirty row pumps 230.

Oscillator 220 generates a PHI signal and an NPHI signal. In this embodiment, PHI and NPHI are directly coupled to row pumps 230. However, these signals may be coupled through one or more oscillator buffers to row pumps 230. Oscillator buffers would buffer the PHI and NPHI signals and generate corresponding signals, which are coupled to row pumps 230. This buffering will minimize the capacitive and other loading on the oscillator 220 signals. In this embodiment, there is one oscillator 220 for an entire integrated circuit 210. Other embodiments of the present invention may have more than one oscillator 220. The signals from oscillator 220 may be routed throughout the integrated circuit to couple to the circuits including row pump 230 which require a high voltage. Oscillator 220 may be implemented using crystal oscillators, phase-locked loop circuits, ring oscillators, counters, frequency generators, and clock generators, among others. Some examples of implementations of oscillator 220 are discussed below.

As discussed above, in the distribution of PHI and NPHI, a plurality of oscillator buffers (e.g., oscillator buffer 225); may be used to buffer the oscillator output signals, which prevents unduly overloading the signal outputs of oscillator 220. Thus, a separate oscillator is not needed for different row pumps. This minimizes the amount of integrated circuit area used by the programming circuitry and avoids potential problems such as synchronization of the PHI and NPHI signals across the chip, among others.

On some integrated circuits, a portion of the row pumps may receive the PHI and NPHI signals, and other row pumps may receive the inverse of the PHI and NPHI signals. The oscillator buffers may be inversion buffers and may incorporate inverters to generate inverse signals. For example, to minimize the amount of charge drop on a power supply during the same cycle of the oscillator, alternating row pumps may be coupled to a different phase (e.g., inversion); of the PHI and NPHI signals.

Row pump 230 generates a high voltage output at an output node 250 in response to the PHI and NPHI signals. The high voltage on output node 250 may be routed to other circuitry on the integrated circuit requiring high voltages. For example, output node 250 may be routed to memory cells, configuration bits, and logical components. As another example, to erase an EEPROM memory cell to a low VT state, a high voltage may be placed at a tunnel dielectric source of the memory cell to remove electrons from the floating gate. To program the EEPROM memory cell to a high VT state, a high voltage may be used to attract electrons into a floating gate. Further, to erase a Flash EEPROM memory cell to a low VT state, a high voltage may be placed at a tunnel dielectric source of the memory cell to remove electrons from the floating gate. To program the Flash EEPROM memory cell to a high VT state, a high voltage may be placed at a control gate of the memory cell to induce a relatively large current flow through the memory cell, which causes electrons to become trapped in the floating gate.

Figure 6:
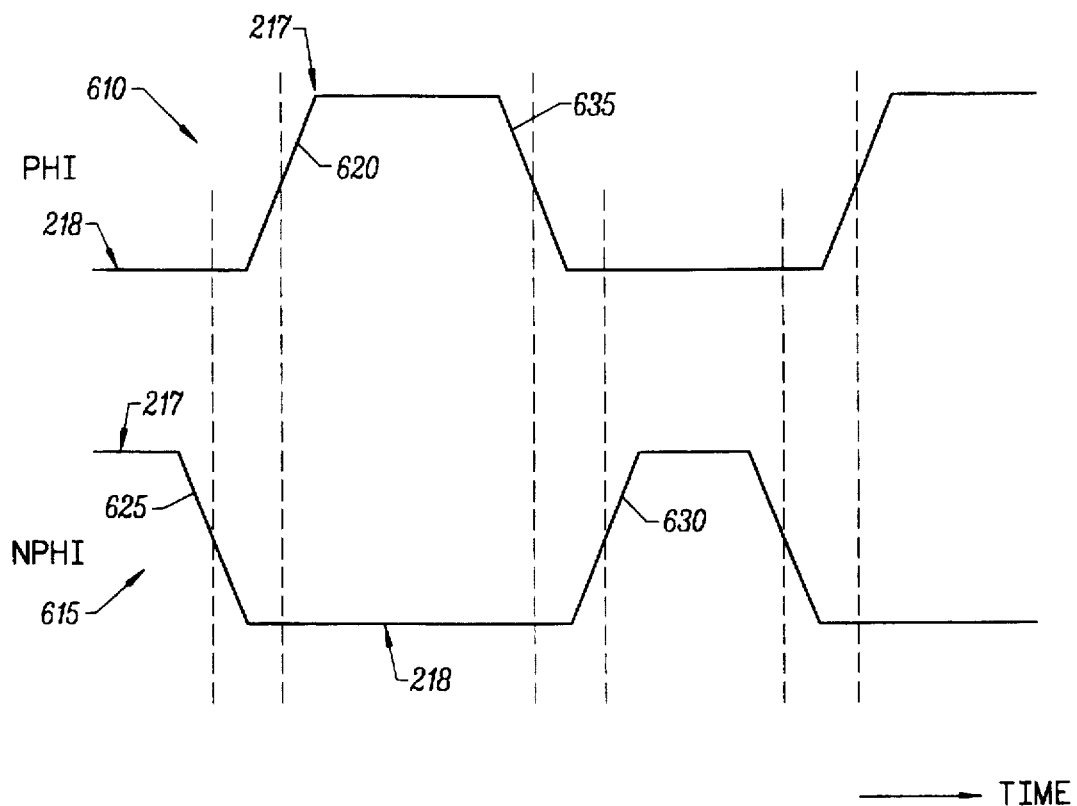
FIG. 6 illustrates waveforms for a nonoverlapping voltage pump scheme.

FIG. 6 shows a nonoverlapping clocking scheme which may be used in a high voltage generation scheme shown in FIG. 5. FIG. 6 shows PHI 610 and NPHI 615 waveforms. In a nonoverlapping clocking scheme, a rising edge 620 of a PHI waveform 610 does not overlap a falling edge 625 of an NPHI waveform 615. Furthermore, a falling edge 635 of PHI waveform 610 does not overlap a rising edge 630 of NPHI waveform 615. Similarly, the edges of NPHI waveform 615 do not overlap the edges of PHI waveform 610. Furthermore, PHI waveform 610 is at the first voltage level 217 when NPHI waveform 615 is at the second voltage level 218. And PHI waveform 610 is at the second voltage level 218 when NPHI waveform 615 is at the first voltage level 217. Therefore, PHI waveform 610 and NPHI waveform 615 may be about 180 degrees out of phase.

Figure 7:
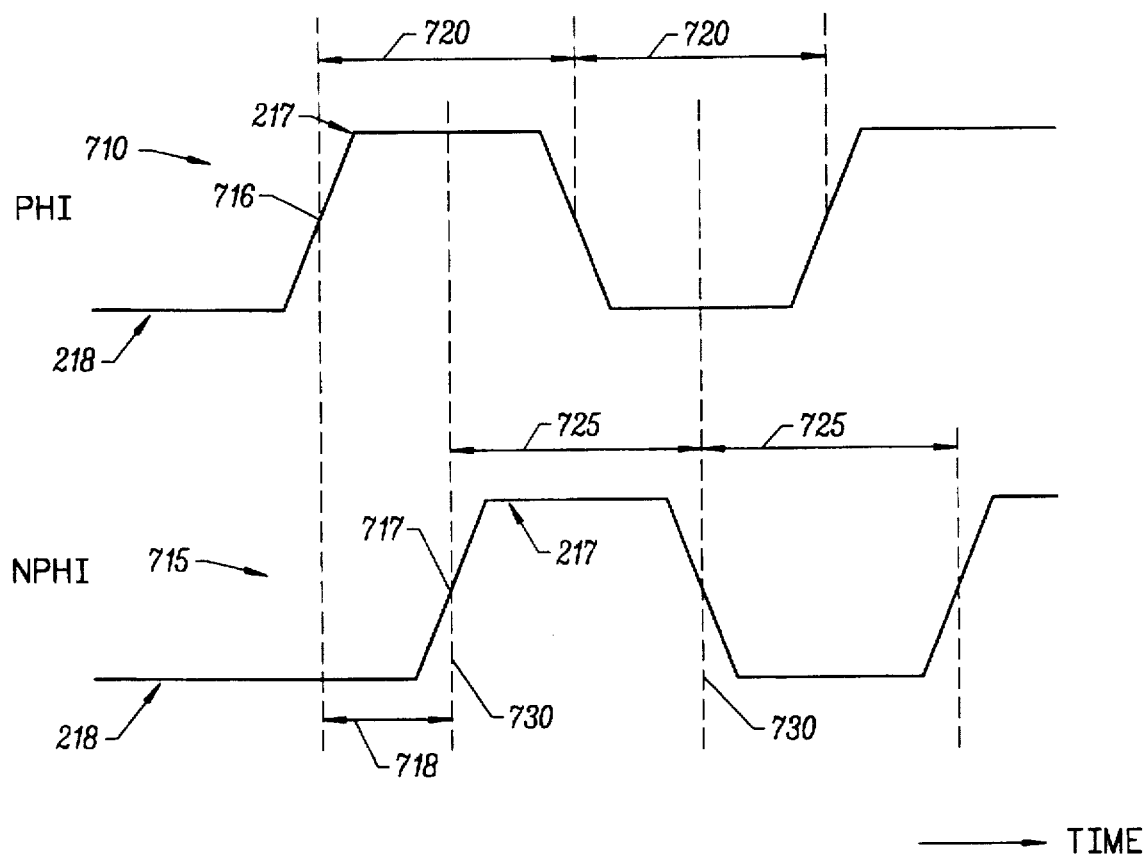
FIG. 7 illustrates waveforms for an overlapping voltage pump scheme.

FIG. 7 shows an overlapping output waveform for PHI and NPHI of oscillator 220 of the present invention. A PHI waveform 710 and NPHI waveform 715 alternate between a first voltage level 217 and a second voltage level 218. The first voltage level is usually the VDD of the integrated circuit, while the second voltage level is usually VSS. PHI waveform 710 and NPHI waveform 715 are generally periodic. PHI waveform 710 may also have the same period and frequency as NPHI waveform 715. Therefore, PHI waveform 710 may be synchronous with NPHI waveform 715, but out of phase. NPHI waveform 715 is generally similar to PHI waveform 710, except for the timing relationship between the two. A rising edge 717 of NPHI waveform 715 follows a rising edge 716 of PHI waveform 710 after a delay 718. Delay 718 is typically not greater than a pulse width 720 of PHI waveform 710. Furthermore, a pulse width 725 of NPHI waveform 715 is generally similar to pulse width 720. In a preferred embodiment, the rising edge 717 of NPHI waveform 715 occurs at approximately a center 730 of pulse width 720 of PHI waveform 710.

In the overlapping clocking scheme of the present invention, the high levels of PHI waveform 710 and NPHI waveform 715 may partially overlap. In fact, NPHI waveform 715 is at the first voltage level 217 when PHI waveform 710 is also at the first voltage level 217. NPHI waveform 715 is at the second voltage level 218 when PHI waveform 710 is also at the second voltage level 218. In a preferred embodiment, NPHI waveform 715 follows PHI waveform 710 by a delay of ninety degrees with respect to PHI waveform 710. This delay 718 need not be exact, as long as PHI waveform 710 rises before NPHI waveform 715, and PHI waveform 710 falls after NPHI waveform 715 rises. By placing the rising edge of NPHI waveform 715 as close as possible to the center 730 of the pulse of the other, the safest amount of margin is obtained to ensure PHI waveform 710 rises before NPHI waveform 715 and falls after NPHI waveform 715 rises.

Figure 8:
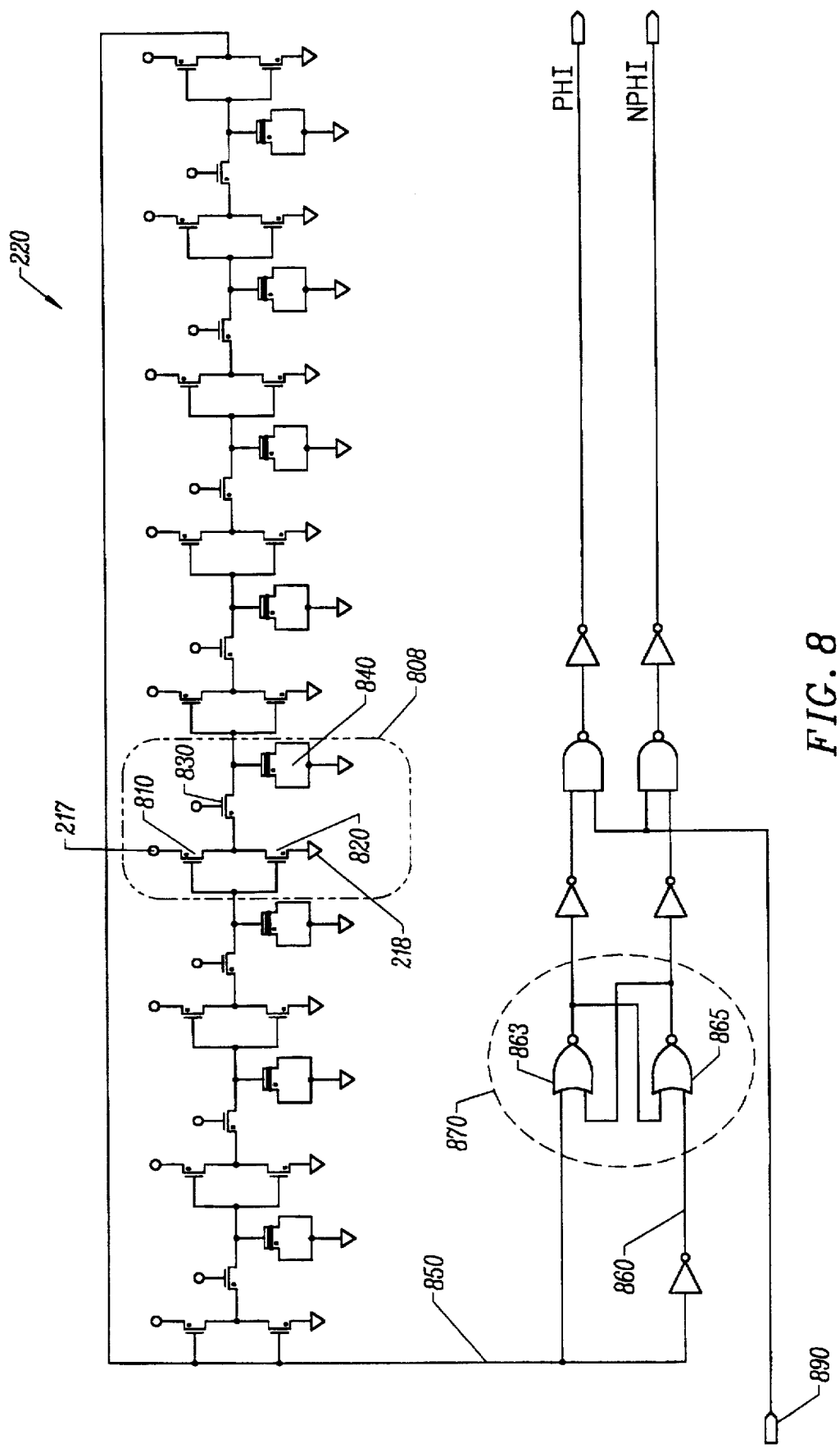
FIG. 8 is a circuit diagram showing an oscillator circuit for creating a nonoverlapping voltage pumping scheme.

FIG. 8 shows an oscillator scheme to create a nonoverlapping clocking scheme of FIG. 6. The clocking signal is created using an ring oscillator, having an odd number of stages. More specifically, in FIG. 8, the ring oscillator has nine stages. This is an implementation of oscillator 220. A stage 808 of the ring oscillator is comprised of a PMOS transistor 810 and an NMOS transistor 820. These transistors, coupled between the first voltage level 217 and the second voltage level 218, form a CMOS inverter. The output of this inverter is fed through an NMOS pass gate 830 to another similar stage of the ring oscillator. A gate of NMOS pass gate 830 is coupled to first voltage level 217. Additional delay is introduced in a stage of the ring oscillator by a capacitor 840 to ground, coupled between an output of pass gate 830 and an input of the next ring oscillator stage. In this embodiment, capacitor 840 is fabricated using an NMOS transistor which is doped with a depletion or similar implant. However, capacitors fabricated using other techniques may also be used. Stages 808 are coupled in series to create a ring oscillator.

Oscillator 220 has an output 850. Capacitor 840 and pass gate 830 are not coupled at output 850 of this embodiment of oscillator 220. However, capacitor 840 and pass gate 830 may be present in other embodiments of the present invention. Output 850 is fed to one input of a NOR gate 863. An inverted output 860 of oscillator 220 is fed to an input of a NOR gate 865. An output of NOR gate 863 is coupled to another input to NOR gate 865. And, an output of NOR gate 865 is used as an input to NOR gate 863. NOR gate 863 and NOR gate 865 form cross-coupled NOR gates 870. These cross-coupled NOR gates 870 guarantee that the resulting PHI and NPHI output signals are nonoverlapping like the waveforms shown in FIG. 6. For example, an output of NOR gate 863 must be low before an output of NOR gate 863 can be high, and vice versa.

Furthermore, the outputs of the cross-coupled NOR gate 870 are buffered through a stage of inverters, a stage of NAND gates, and a final stage of inverters. At the NAND gate level, an enable signal 890 is used to enable and disable PHI and NPHI. If enable 890 is a logic low, PHI and NPHI will be logic low. If enable 890 is a logic high, PHI and NPHI will be oscillating waveforms.

Figure 9:
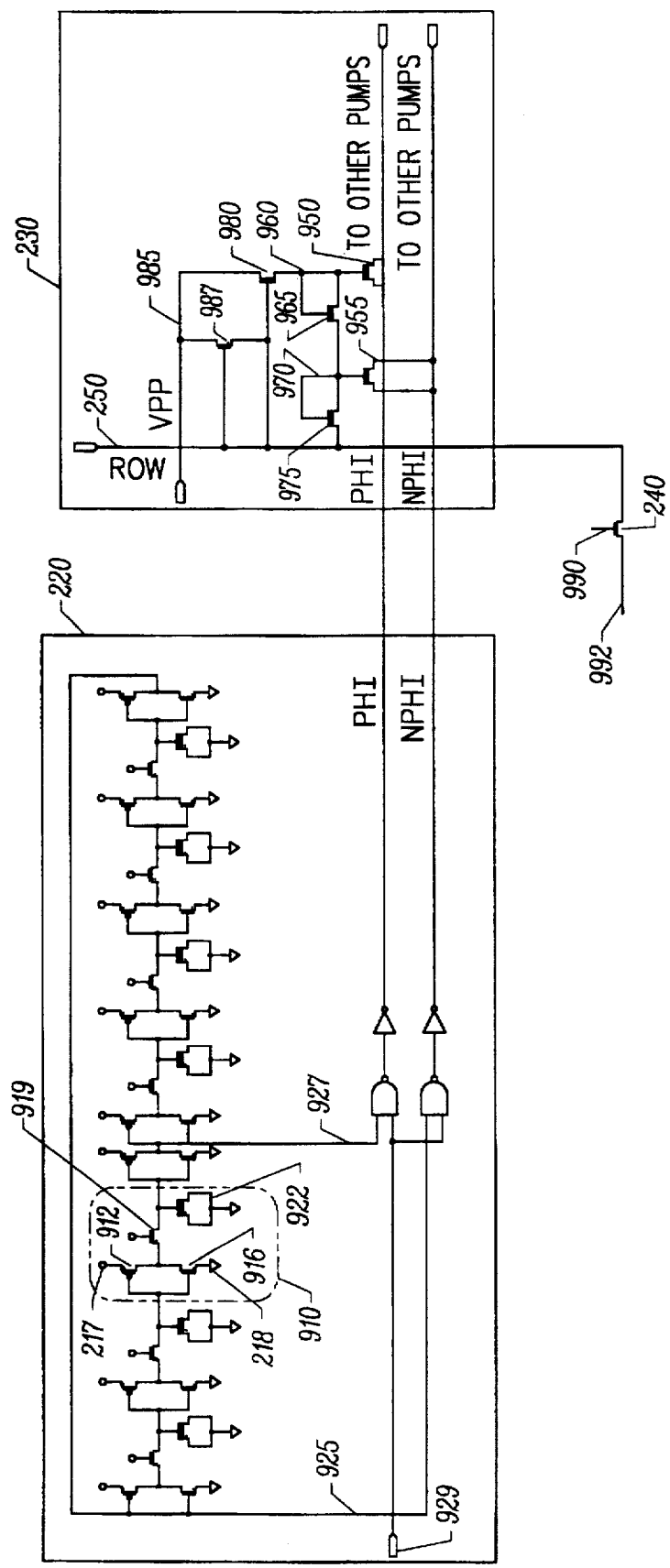
FIG. 9 is a circuit diagram showing an embodiment of a voltage pump with the overlapping clocking scheme of the present invention.

FIG. 9 shows a block schematic for the overlapping clocking scheme of the present invention. This scheme comprises oscillator 220, row pump 230, and selection device 240. As discussed above, oscillator 220 may be coupled through an oscillator buffer to row pump 230. Oscillator 220 of the present invention is comprised of a ring oscillator with an odd number of stages. More specifically, oscillator 220 has nine stages. Stage 910 of the ring oscillator of the present invention is similar to a stage of the ring oscillator of FIG. 8. A stage 910 of the ring oscillator is comprised of a CMOS inverter, formed by a PMOS transistor 912 and an NMOS transistor 916. These transistors are coupled between the first voltage supply 217 and the second voltage supply 218. The output of this inverter is fed through an NMOS pass gate 919 to another similar stage of the ring oscillator. A gate of the NMOS pass gate is coupled to first voltage supply 217. Additional delay is introduced in a stage of the ring oscillator by a capacitor 922 to ground, coupled between an output of pass gate 919 and an input of the next ring oscillator stage. In this embodiment, capacitor 922 is fabricated using an NMOS transistor which is doped with a depletion or similar implant. However, capacitors fabricated using other techniques may also be used. Stages 910 are coupled in series to create a ring oscillator.

The outputs from the ring oscillator used to generate the PHI and NPHI signals in a preferred embodiment may be taken from opposite sides of the ring oscillator. More specifically, in the present invention, an output 925 of the oscillator is taken from between the ninth and the first stage. Capacitor 922 and pass gate 919 are not coupled to output 925 of this embodiment of oscillator 220. An inverted output 927 of the ring oscillator is generated between the fourth and fifth stages of the ring oscillator. Capacitor 922 and pass gate 919 are not coupled to inverted output 927 of this embodiment of oscillator 220. Output 925 and inverted output 927 are used to generate the PHI and NPHI waveforms shown in FIG. 7. In the present embodiment, output 925 is selected after the ninth stage of the oscillator and inverted output 927 is selected after the fourth stage of the oscillator. This ensures the output waveforms are overlapping. As discussed earlier, this means that the inverted output 927 waveform follows the output 925 waveform by some delay, less than a pulse width of the output 925 waveform. In a specific embodiment, the output 925 waveform is approximately ninety degrees out-of-phase with the inverted 927 output waveform.

Output 925 and inverted output 927 are buffered through a stage of NAND gates and a stage of inverters. At the NAND gate stage, an enable signal 929 is used to enable and disable PHI and NPHI. If enable 929 is a logic low, PHI and NPHI will be logic low. If enable 929 is a logic high, PHI and NPHI will produce oscillating waveforms. Enable 929 may enable oscillator output for the entire integrated circuit.

Compared to the oscillator 220 of FIG. 8, oscillator 220 of FIG. 9 is generally a simpler design because a cross-coupled NOR pair 870 is not used. This also saves valuable integrated circuit area. Further, oscillator 220 of FIG. 9 takes inverted output 927 directly from the ring oscillator, which guarantees the synchronicity and relationship of the inverted output 927 to the noninverted output 925. For example, despite process and design variations, output 925 and inverted output 927 will track one another to maintain the overlapping feature of the present invention.

On an integrated circuit, oscillator 220 may be coupled through one or more oscillator buffers to feed to a plurality of row pumps 230. Furthermore, an oscillator buffer may have logic to disable pumping of selected row pumps 230. This feature may be used to disable operation of a portion of the row pumps 230 on the integrated circuit. For example, memory cells may be selectively programmed using this feature.

Row pump 230 generates high voltages for the integrated circuit. Row pump 230 is a two-stage high voltage pump. Other types of voltage pumps with a greater number of stages may be used with the present invention. The particular embodiment described is for the purpose of illustrating the features and principles of the present invention. In row pump 230, PHI is coupled to a terminal of capacitor 950. NPHI is coupled to a terminal of capacitor 955. Capacitors 950 and 955 may be fabricated and designed using many different techniques and semiconductor materials. For example, in the embodiment shown, capacitors 950 and 955 are designed using NMOS transistors where a gate is used as a first terminal and a source and a drain are used as a second terminal. To provide for better capacitive characteristics, these NMOS transistors may be implanted specially to lower the threshold voltage of the transistors. For example, capacitors 950 and 955 may be native devices. Native devices have a threshold voltage lower than that for enhancement devices. Native devices are fabricated by not implanting transistor devices with a threshold voltage adjustment implant.

Capacitor 950 is coupled between PHI and a node 960. A transistor 965 is coupled between node 960 and a node 970. A gate of transistor 965 is coupled to node 960. A transistor 975 is coupled between an output node 250 and node 970. A gate of transistor 975 is coupled to node 970. Furthermore, NPHI is coupled to one terminal of capacitor 955, while the other terminal of capacitor 955 is coupled to node 970. A transistor 980 is coupled between a VPP node 985 and node 960. A gate of transistor 980 is coupled to output node 250. A transistor 987 is coupled between VPP 985 and output node 250. A gate of transistor 987 is coupled to output node 250.

During the following discussion on the operation of row pump 230, please refer to the PHI and NPHI waveforms shown in FIG. 7. PHI is capacitively coupled through capacitor 950 to node 960. On a rising edge 716 of PHI, the voltage or charge at node 960 is boosted by an amount proportional to the change in voltage between the first and second voltage supplies, which is approximately VDD. Similarly, NPHI is capacitively coupled through capacitor 955 to node 970. On a rising edge 717 of NPHI, the voltage or charge at node 970 is boosted by an amount proportional to the change in voltage between the first and second voltage supplies, which is approximately VDD.

Depending on the fabrication process used and the characteristics of the particular devices, capacitors 950 and 955 have a coupling ratio, which indicates its efficiency at coupling charge from one terminal to the other. In typical integrated circuits, the coupling ratio of capacitors 950 and 955 is about 80 percent, although higher coupling ratios are also possible. Therefore, after one iteration of row pump 230, node 960 will be raised a voltage approximately 80 percent of VDD above the charge or voltage already at node 960. For example, if after the first iteration, node 960 is at VDD−2 VT, when PHI rises, the node 960 voltage will be boosted an additional 80 percent of VDD (i.e., VDD−2 VT+(80%*VDD)).

While PHI is high, the charge or voltage at node 960, minus a VT, is passed through transistor 965 to node 970. In the overlapping clocking scheme of the present invention, after a delay 718, at the rising edge 717 of NPHI signal node 970 will be raised a voltage approximately 80 percent of VDD above the charge or voltage already at node 970. For example, since at the first iteration, node 970 is already at VDD−3 VT+(80%*VDD), when NPHI rises, the node 960 voltage will be boosted an additional 80 percent of VDD (i.e., VDD−3 VT+2*(80%*VDD)). While NPHI is high, the charge or voltage at node 970, minus a VT, is passed through transistor 975 to output node 250.

While NPHI is low, the charge at node 970 is at a maximum after PHI has gone high. Therefore, at the time of rising edge 717 of NPHI, the capacitive coupling from NPHI to node 970 occurs from about the highest possible level, transferring more charge to output node 250. Compared to a nonoverlapping clocking scheme, the present invention has greater efficiency. Since PHI has gone low in the nonoverlapping case, the charge on node 970 has been reduced by backward capacitive coupling to node 960 (due to parasitic overlap capacitance). Furthermore, since the present invention offers greater efficiency, the sizes for capacitors 950 and 955 can be reduced significantly. In a particular instance, capacitors 950 and 955 are approximately sixty percent of the size of similar capacitors used for the nonoverlapping clocking scheme. More specifically, for the overlapping scheme, the capacitors may require an area of approximately fifty square microns, while for the nonoverlapping scheme, the capacitors may require an area of about thirty square microns. The savings in integrated circuit area may be considerable since there are typically many row pumps 230 in an integrated circuit.

Then, when PHI returns low, transistor 965 does not allow charge from node 970 to return to node 960. The charge at node 960 is refreshed by a charge at VPP 985. The voltage level at VPP 985 is normally at or above the first voltage level. In some embodiments, VPP 985 is a high voltage level (e.g., 13 volts) generated by another high voltage pump or high voltage source, external or internal to the integrated circuit. After PHI returns low, NPHI returns low. When NPHI returns low, transistor 975 does not allow charge from output node 250 to return to node 970. A concern during the down cycle of NPHI is to reduce back coupling to node 970. In particular, this is accomplished by reducing the device widths and minimizing the overlap capacitance in the layout of the devices.

During each successive iteration of the pump, node 960 is continually boosted and charge is continually transferred to node 970. Node 970 is boosted and charge is continually transferred to output node 250. Output node 250 continues to collect charge, and its voltage will gradually rise accordingly. Theoretically, the voltage at output node 250 can be raised to any arbitrarily high voltage level. However, in practice, there are usually some parasitic devices such as transistors along output node 250 that break down at a breakdown voltage. For example, a transistor may be coupled to output node 250 in order to limit the high voltage at output node 250 to a transistor breakdown voltage. In many processes, the transistor breakdown voltage is approximately from 12 volts to 14 volts. Furthermore, as output node 250 increases in voltage, this voltage is fed back to a gate of transistor 980, which passes charge from VPP 985 to node 960 to help maintain a high voltage on output node 250. The voltage at node 960 may be as high as the high voltage at output node 250 voltage minus a VT. For example, if VPP 985 is at the output node voltage, then node 960 will see about the output node 250 voltage minus a VT.

Furthermore, in the embodiment shown in FIG. 9, transistor 987 limits the voltage at output node 250 to the voltage at VPP 985 plus a VT. This embodiment is useful when a relationship must be maintained between the VPP 985 voltage and the output node 250 voltage. Such a relationship may be useful when programming memory cells. For example, if the VPP 985 voltage is 13 volts and a VT is approximately 1.5 volts, then the output node 250 voltage will be limited to about 14.5 volts. For example, in some integrated circuits, two high voltages, one at 14.5 volts and another at about 13 volts may be used in the programming scheme to program programmable cells. Output node 250 may be used to turn on a pass gate used to pass the VPP 985 voltage to a row of memory cells. In order to pass a full-level VPP 985 voltage to the memory cells, the gate of the pass gate must be elevated to the VPP 985 voltage plus a VT. In other embodiments of the present invention where such a relationship is unnecessary, transistor 987 may be omitted.

A further feature of the present invention is that overlapping clocking scheme improves the efficiency of high voltage pumps regardless of the process technology used. However, the advantages of the present invention are especially useful when used with processes with high gate to source drain overlap capacitances. As stated previously, in the present invention, the capacitors 950 and 955 are approximately 60 percent of the sizes for comparable capacitors in a circuit using a nonoverlapping scheme. This results in a substantial reduction in the amount of integrated circuit area required compared to the nonoverlapping clocking scheme case.

The embodiment of FIG. 9 is an example of the use of high voltage generation for programming programmable cells. Therefore, a selection device 240 is coupled to output node 250. In this case, selection device 240 is a transistor, however in further embodiments, a more complex circuit such as a shift register may be used. Selection device 240 has a control node 990 and an input node 992. Control node 990 is used to pass a voltage at input node 992 to output node 250. Using selection device 240, output node 250 may be selectively not charged to a high voltage. For example, if selection device 240 grounds output node 250, then a row of memory cells may not be programmed.

Figure 10:
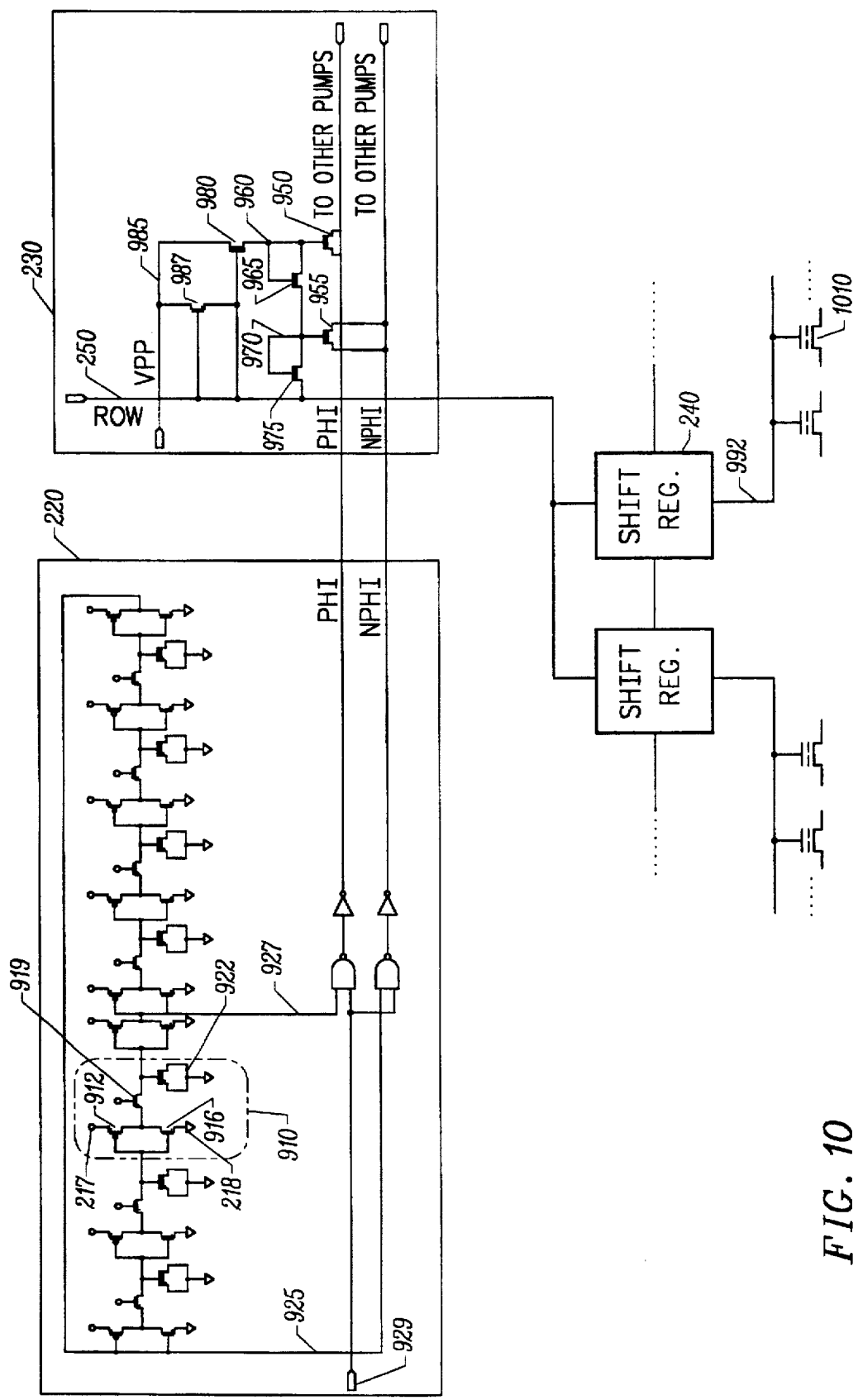
FIG. 10 is a circuit diagram showing an embodiment of a voltage pump with the overlapping clocking scheme of the present invention incorporating shift registers.

Furthermore, when selection device 240 is a shift register, the shift register is comprised of an input and an output. One shift register may be used for a row of memory cells. The output of one shift register is fed into the input of another shift register. In a serpentine chain, data is serially shifted throughout the integrated circuit. The shift register clocks in data from its input during a rising clock edge and clocks out data to its output during a falling clock edge. Depending on the logic used, the shift register may clock in the data during a falling clock edge and clock out the data during a rising clock edge. Overall, in a programming scheme, the data in the shift register may be used for a multitude of purposes. For example, the shift register may selectively determine which rows of programmable cells to program or not program. The shift register may "ground" output node 250 (to prevent a high voltage at output node 250) for a row of cells which are not to be programmed. FIG. 10 shows such a scheme incorporating shift registers 240 and floating gate memory devices 1010.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A method for generating voltages on an integrated circuit comprising:

generating a first clock signal, said first clock signal alternating between a first voltage level and a second voltage level, said first voltage level is above said second voltage level;

generating a second clock signal, said second clock signal is at a frequency of said first clock signal, wherein a rising edge of said second clock signal follows a rising edge of said first clock signal after a delay, said delay less than a pulse width of said first clock signal, said second clock signal alternating between said first voltage level and said second voltage level;

charging a first node with said first clock signal;

transferring a charge of said first node to a second node;

charging said second node with said second clock signal;

transferring a charge of said second node to a third node; and producing a third voltage level at said third node by repeating said steps of charging said first node, transferring charge to said second node, charging said second node, and transferring charge to said third node, said third voltage level is above said first voltage level.

2. The method of claim 1 further comprising:

limiting said third voltage level to a transistor breakdown voltage.

3. The method of claim 1 further comprising:

coupling said third voltage level to a floating gate of a transistor; and programming said transistor with said third voltage level.

4. The method of claim 1 wherein a falling edge of said second clock signal follows a falling edge of said first clock signal.

5. The method of claim 1 wherein said first clock signal is generated by a ring oscillator.

6. The method of claim 1 wherein said first clock signal is generated from a first position of a ring oscillator and said second clock signal is generated from a second position of said ring oscillator, wherein said first position and said second position are separated by at least two buffer stages in said ring oscillator.

7. The method of claim 1 wherein said rising edge of said second clock signal occurs at approximately a center of said pulse width of said first clock signal.

8. The method of claim 1 used within a programmable logic integrated circuit.

9. The method of claim 1 wherein said charging a first node occurs by coupling said first clock signal through a capacitor to said first node.

10. The method of claim 9 wherein said capacitor is a native device transistor, said native device transistor having a threshold voltage less than an enhancement transistor on said integrated circuit.

11. A system of programming memory cells comprising:

a clock generator, generating a first clock signal and a second clock signal, said second clock signal is at a frequency of said first clock signal, wherein a rising edge of said second clock signal follows a rising edge of said first clock signal after a delay, said delay not greater than a pulse width of said first clock signal;

an inversion buffer, coupled to said clock generator, said inversion buffer generating a third clock signal, about 180 degrees out-of-phase with said first clock signal, and a fourth clock signal, about 180 degrees out-of-phase with said second clock signal;

a first pump generating a first relatively consistent voltage output, wherein a first stage of said first pump is coupled to said first clock signal and a second stage of said first pump is coupled to said second clock signal; and a second pump generating a second relatively consistent voltage output said second pump substantially identical to said first pump, wherein a first stage of said second pump is coupled to said third clock signal and a second stage of said second pump is coupled to said fourth clock signal, and said second voltage output is separate from said first voltage output.

12. The system of claim 11 wherein the first voltage output is substantially the same as the second voltage output.

13. The system of claim 11 further comprising:
a plurality of programmable memory cells, wherein the first voltage output is coupled to a first row of said plurality of programmable memory cells and said second voltage output is coupled to a second row of said plurality of programmable memory cells.

14. The system of claim 11 wherein the first voltage output and second voltage output are above a supply voltage to the system.

15. The system of claim 11 wherein a falling edge of said second clock signal follows a falling edge of said first clock signal.

16. The system of claim 11 wherein said clock generator is a ring oscillator.

17. The system of claim 11 wherein said first pump further comprises:
a first capacitor in said first stage; and
a second capacitor in said second stage.

18. The system of claim 17 wherein said first capacitor and said second capacitor are implemented using native transistors.

19. The system of claim 11 wherein said delay is less than a pulse width of said first clock signal.

20. A system for generating a voltage on an integrated circuit comprising:
a clock generator, generating a first clock signal and a second clock signal, said second clock signal overlapping with said first clock signal; and
a voltage pump, wherein said first clock signal is coupled to drive a first capacitor of said voltage pump, and said second clock signal is coupled to drive a second capacitor of said voltage pump, wherein charge generated using said first capacitor is further used to charge said second capacitor to provide said voltage.

21. The system of claim 20 wherein a rising edge of said second clock signal follows a rising edge of said first clock signal after a delay, said delay not greater than a pulse width of said first clock signal.

22. The system of claim 20 wherein said first capacitor and said second capacitor are transistors.

23. The system of claim 20 wherein said voltage pump generates a high voltage of at least greater than a system voltage.

24. The system of claim 20 further comprising an oscillator buffer that buffers said first clock signal and said second clock signal to said voltage pump.

25. The system of claim 20 wherein a shift register is coupled to said voltage pump, said shift register indicates a row of programmable cells to configure using said voltage pump.

26. A system for generating a voltage on an integrated circuit comprising:
a clock generator, generating a first clock signal and a second clock signal, wherein said second clock signal is overlapping with said first clock signal and is about ninety degrees out-of-phase with a rising edge of said first clock signal; and
a voltage pump, wherein said first clock signal is coupled to drive a first capacitor of said voltage pump, and said second clock signal is coupled to drive a second capacitor of said voltage pump, wherein charge generated using said first capacitor is further used to charge said second capacitor to provide said voltage.

27. A system for generating a voltage on an integrated circuit comprising:
a clock generator, generating a first clock signal and a second clock signal, wherein said second clock signal is overlapping with said first clock signal and wherein said clock generator is an oscillator, comprising an odd number of stages, wherein said first clock signal is produced at one position of said oscillator, and said second clock signal is produced at a different position of said oscillator; and
a voltage pump, wherein said first clock signal is coupled to drive a first capacitor of said voltage pump, and said second clock signal is coupled to drive a second capacitor of said voltage pump, wherein charge generated using said first capacitor is further used to charge said second capacitor to provide said voltage.

28. A system for generating a voltage on an integrated circuit comprising:
a first signal source producing a first clock signal;
a second signal source producing a second clock signal, wherein a rising edge of said second clock signal occurs when a portion of said first clock signal is a logic high; and
a voltage pump generating a relatively stable voltage output, coupled to said first clock signal source and said second clock signal source, wherein charge generated using said first clock signal source is further used to charge a second charge generated by using said second clock signal source to provide said voltage.

29. The system of claim 28 wherein said first clock signal is synchronous with said second clock signal, and wherein a rising edge of said second clock signal follows a rising edge of said first clock signal after a delay, said delay not greater than a pulse width of said first clock signal.

30. A programmable logic device comprising a system as recited in claim 28.

31. The system of claim 28 wherein the voltage pump generates a voltage above a system voltage.

32. A system for generating voltages on an integrated circuit comprising:
a first signal source producing a first clock signal;
a second signal source producing a second clock signal, wherein a rising edge of said second clock signal occurs when a portion of said first clock signal is a logic high; and
a voltage pump generating a voltage output, coupled to said first clock signal source and said second clock signal source, wherein charge generated using said first clock signal source is further charged using said second clock signal source, and wherein said voltage pump comprises:
a first transistor, coupled between a high voltage node and a first node, wherein a gate of said first transistor is coupled to an output node;
a second transistor, coupled between said high voltage node and said output node, wherein a gate of said second transistor is coupled to said output node;
a third transistor, coupled between said first node and a second node, wherein a gate of said third transistor is coupled to said first node;
a first capacitor, coupled between first node and said first clock signal of said first signal source;
a fourth transistor, coupled between said second node and said output node, wherein a gate of said fourth transistor is coupled to said second node; and a second capacitor, coupled between said second node and said second clock signal of said second signal source.

33. A system for generating voltages on an integrated circuit comprising:

a clock generator, generating a first clock signal and a second clock signal, said second clock signal is at a frequency of said first clock signal, wherein a rising edge of said second clock signal follows a rising edge of said first clock signal after a delay, said delay not greater than a pulse width of said first clock signal;

an inversion buffer, coupled to said clock generator, said inversion buffer generating a third clock signal, about 180 degrees out-of-phase with said first clock signal, and a fourth clock signal, about 180 degrees out-of-phase with said second clock signal;

a first pump generating a first relatively stable voltage output, wherein a first stage of said first pump is coupled to said first clock signal and a second stage of said first pump is coupled to said second clock signal; and second pump generating a second relatively stable voltage output, said second pump substantially identical to said first pump, wherein a first stage of said second pump is coupled to said third clock signal and a second stage of said second pump is coupled to said fourth clock signal, and said second voltage is separate from said first voltage output.

34. A programmable logic integrated circuit comprising a system as recited in claim 33.

35. A method for generating voltages on an integrated circuit comprising:

generating a first clock signal, said first clock signal alternating between a first voltage level and a second voltage level, said first voltage level is above said second voltage level;

generating a second clock signal, said second clock signal is at a frequency of said first clock signal, wherein a rising edge of said second clock signal occurs when a portion of said first clock signal is a logic high, said second clock signal alternating between said first voltage level and said second voltage level;

charging a first node with said first clock signal;

transferring a charge of said first node to a second node;

charging said second node with said second clock signal;

transferring a charge of said second node to a third node; and producing a third voltage level at said third node by repeating said steps of charging said first node, transferring charge to said second node, charging said second node, and transferring charge to said third node, said third voltage level is above said first voltage level.

36. A system of programming memory cells comprising:

a clock generator, generating a first clock signal and a second clock signal, said second clock signal is at a frequency of said first clock signal, wherein a rising edge of said second clock signal follows a rising edge of said first clock signal after a delay, said delay not greater than a pulse width of said first clock signal;

an inversion buffer, coupled to said clock generator, said inversion buffer generating a third clock signal, about 180 degrees out-of-phase with said first clock signal, and a fourth clock signal, about 180 degrees out-of-phase with said second clock signal;

a first pump generating a first voltage output, wherein a first stage of said first pump is coupled to said first clock signal and a second stage of said first pump is coupled to said second clock signal; and a second pump generating a second voltage output, said second pump substantially identical to said first pump, wherein a first stage of said second pump is coupled to said third clock signal and a second stage of said second pump is coupled to said fourth clock signal wherein the first and second voltage outputs are limited to a transistor breakdown voltage.

37. A system for generating a voltage on an integrated circuit comprising:

a first signal source producing a first clock signal;

a second signal source producing a second clock signal, wherein a rising edge of said second clock signal occurs when a portion of said first clock signal is a logic high, and a falling edge of said second clock signal occurs when a portion of said first clock signal is a logic low; and a voltage pump, coupled to said first clock signal source and said second clock signal source, wherein charge generated using said first clock signal source is further used to charge a second charge generated by using said second clock signal source to provide said voltage.

38. A method for generating voltages on an integrated circuit comprising:

generating a first clock signal, said first clock signal alternating between a first voltage level and a second voltage level, said first voltage level above said second voltage level;

generating a second clock signal, said second clock signal is at a frequency of said first clock signal, wherein a rising edge of said second clock signal follows a rising edge of said first clock signal after a delay and said rising edge of said second clock signal occurs at approximately a center of a pulse width of said first clock signal, said second clock signal alternating between said first voltage level and said second voltage level;

charging a first node with said first clock signal;

transferring a charge of said first node to a second node;

charging said second node with said second clock signal;

transferring a charge of said second node to a third node; and producing a third voltage level at said third node by repeating said steps of charging said first node, transferring charge to said second node, charging said second node, and transferring charge to said third node, said third voltage level is above said first voltage level.

39. A system for generating voltages on an integrated circuit comprising:

a first signal source producing a first clock signal;

a second signal source producing a second clock signal, wherein a rising edge of said second clock signal occurs when a portion of said first clock signal is a logic high; and a voltage pump, coupled to said first clock signal source and said second clock signal source, wherein said voltage pump comprises:

a first transistor, coupled between a high voltage node and a first node, wherein a gate of said first transistor is coupled to an output node;

a second transistor, coupled between said high voltage node and said output node, wherein a gate of said second transistor is coupled to said output node;

a third transistor, coupled between said first node and a second node, wherein a gate of said third transistor is coupled to said first node;

a first capacitor, coupled between said first node and said first clock signal of said first signal source;

a fourth transistor, coupled between said second node and said output node, wherein a gate of said fourth transistor is coupled to said second node; and a second capacitor, coupled between said second node and said second clock signal of said second signal source.

* * * * *